US012679701B2

(12) United States Patent
Takaki et al.

(10) Patent No.: US 12,679,701 B2
(45) Date of Patent: Jul. 14, 2026

(54) LIFTING MAGNET AND STEEL PLATE LIFTING APPARATUS, AND STEEL PLATE CONVEYING METHOD

(71) Applicant: JFE STEEL CORPORATION, Tokyo (JP)

(72) Inventors: Yuki Takaki, Tokyo (JP); Yusuke Yoshinari, Tokyo (JP); Kyohei Ishida, Tokyo (JP); Masami Tate, Tokyo (JP); Takeshi Taki, Nagano (JP)

(73) Assignee: JFE STEEL CORPORATION, Tokyo (JP)

( * ) Notice: Subject to any disclaimer, the term of this patent is extended or adjusted under 35 U.S.C. 154(b) by 910 days.

(21) Appl. No.: 17/926,016

(22) PCT Filed: May 20, 2021

(86) PCT No.: PCT/JP2021/019144
§ 371 (c)(1),
(2) Date: Nov. 17, 2022

(87) PCT Pub. No.: WO2021/241392
PCT Pub. Date: Dec. 2, 2021

(65) Prior Publication Data
US 2023/0174347 A1      Jun. 8, 2023

(30) Foreign Application Priority Data

May 26, 2020      (JP) ................................ 2020-091097

(51) Int. Cl.
B66C 1/08       (2006.01)
B66C 13/18      (2006.01)
G01R 33/07      (2006.01)

(52) U.S. Cl.
CPC ................ B66C 1/08 (2013.01); B66C 13/18 (2013.01); G01R 33/07 (2013.01)

(58) Field of Classification Search
CPC .. B66C 1/06; B66C 1/08; B66C 13/18; G01R 33/07; H01F 7/18
(Continued)

(56) References Cited

U.S. PATENT DOCUMENTS 6,154,353 A      11/2000   Bowers et al.

FOREIGN PATENT DOCUMENTS

CN           2399363 Y     10/2000
CN       204342244 U       5/2015
(Continued)

OTHER PUBLICATIONS

Machine translation of Tremba German Patent Document DE 102018101945 A1 Aug. 2019 (Year: 2019).*
(Continued)

*Primary Examiner* — Kevin J Comber
(74) *Attorney, Agent, or Firm* — Oliff PLC

(57)                     ABSTRACT

A lifting magnet including a plurality of electromagnetic coils that are disposed in a nesting arrangement and capable of being independently ON/OFF-controlled and voltage-controlled. By using the plurality of electromagnetic coils in a selective or appropriately combined manner, the lifting magnet secures a sufficient magnetic flux penetration depth during conveyance of steel plates, and can easily and highly precisely control the magnetic flux penetration depth in accordance with the number of steel plates to be lifted.

10 Claims, 7 Drawing Sheets

(58) Field of Classification Search
USPC ......................................................... 361/144
See application file for complete search history.

(56) References Cited

FOREIGN PATENT DOCUMENTS

| | | | | | |
|---|---|---|---|---|---|
| DE | 102018101945 | A1 * | 8/2019 | .............. | B66C 1/06 |
| GB | 1187557 | A | 4/1970 | | |
| JP | S51-76564 | A | 7/1976 | | |
| JP | 63-62479 | U1 | 4/1988 | | |
| JP | H02-295889 | A | 12/1990 | | |
| JP | H06-227785 | A | 8/1994 | | |
| JP | H11-512032 | A | 10/1999 | | |
| JP | 2000-226179 | A | 8/2000 | | |
| JP | 2007-217119 | A | 8/2007 | | |
| JP | 2008-265997 | A | 11/2008 | | |
| KR | 10-2012-0073164 | A | 7/2012 | | |
| KR | 20120073164 | A * | 7/2012 | .............. | B66C 1/08 |
| KR | 20200016846 | A | 2/2020 | | |
| TW | M486643 | U | 9/2014 | | |
| WO | 2018200948 | A1 | 11/2018 | | |
| WO | 2019/107504 | A1 | 6/2019 | | |

OTHER PUBLICATIONS

Machine translation of Choi Korean Patent Document KR 20120073164 A Jul. 2012 (Year: 2012).*

Aug. 25, 2023 Extended European Search Report issued in European Patent Application No. 21812401.4.

Oct. 17, 2024 Office Action issued in Korean Patent Application No. 10-2022-7039417.

Jan. 4, 2022 Office Action issued in Taiwanese Patent Application No. 110118664.

Sep. 7, 2022 Office Action issued in Taiwanese Patent Application No. 110118664.

Aug. 2, 2022 Office Action issued in Japanese Patent Application No. 2021-549983.

Aug. 3, 2021 International Search Report issued in International Patent Application No. PCT/JP2021/019144.

Jul. 10, 2025 Office Action issued in Korean Patent Application No. 10-2022-7039417.

Nov. 17, 2023 Office Action issued in Taiwanese Patent Application No. 110118664.

May 16, 2026 Office Action issued in Chinese Patent Application No 202180034951.9 with concise explanation of relevance.

* cited by examiner

LIFTING MAGNET AND STEEL PLATE LIFTING APPARATUS, AND STEEL PLATE CONVEYING METHOD

TECHNICAL FIELD

This application relates to a lifting magnet and a steel plate lifting apparatus that are used to lift and convey steel plates, for example, in steel works and steel material processing plants, and also relates to a steel plate conveying method.

BACKGROUND

A plate mill in a steel works generally includes a rolling facility, a finishing facility, and a product warehouse. In the rolling facility, a rolling step is performed which involves rolling a block of steel material to a desired thickness. In the finishing facility, a finishing step is performed which involves cutting into a shipping size, removing burrs from edges, repairing surface flaws, and inspecting internal flaws. In the product warehouse, steel plates awaiting shipment are stored.

Steel plates that are in-process in the finishing step and steel plates that are waiting shipment in the product warehouse, are stored in stacks of several to more than a dozen layers because of space constrains. For transfer or shipment of steel plates, one to several steel plates are lifted and moved by using an electromagnetic lifting magnet attached to a crane.

An internal structure of a typical electromagnetic lifting magnet is illustrated in the vertical cross-sectional view of FIG. 10. The lifting magnet includes therein a coil 100 with a diameter of one hundred to several hundred millimeters. An inner pole 101 (inner pole iron core) is disposed inside the coil 100, and an outer pole 102 (outer pole iron core) is disposed outside the coil 100. A yoke 103 is in contact with, and secured to, the upper ends of the inner pole 101 and the outer pole 102. By bringing the inner pole 101 and the outer pole 102 into contact with a steel plate, with the coil 100 being in an energized state, a magnetic field circuit is formed and the steel plate is attracted to the lifting magnet. To secure sufficient lifting force, a lifting magnet used in a steel works causes one large coil 100 to produce a magnetic flux, and is designed in such a way that the density of magnetic flux passing through the inner pole 101 is typically 1 T (=10000 G) or more.

To control the number of steel plates attracted to the lifting magnet, it is necessary to control the magnetic flux penetration depth to which the magnetic flux reaches, depending on the plate thickness of steel plates and the number of steel plates to be lifted. For a lifting magnet conventionally used, it is difficult to control the magnetic flux penetration depth with high precision, and thus is operationally difficult to lift exactly a predetermined number of steel plates at one time. Accordingly, after more steel plates than the predetermined number are attracted, excess ones are dropped by regulating current in the lifting magnet or by turning on and off the lifting magnet, so that the number of steel plates to be attracted is adjusted. Depending on the skill of the operator who operates the crane, however, the process needs to be repeated many times and this leads to significant loss of work efficiency. Moreover, the operation of adjusting the number of steel plates to be attracted, as described above, is a significant hindrance to automating the crane operation.

As solutions to the problems described above, techniques that can automatically control the number of steel plates to be lifted have been proposed. Examples of such techniques include a method that controls current applied to a coil of a lifting magnet to control lifting force (Patent Literature 1), and a lifting magnet that includes a plurality of small electromagnets that are independently excited (Patent Literature 2).

CITATION LIST

Patent Literature

PTL 1: Japanese Unexamined Patent Application Publication No. 2-295889
PTL 2: Japanese Unexamined Patent Application Publication No. 2000-226179

SUMMARY

Technical Problem

The method described in Patent Literature 1 is a method that controls current in the coil to control the output of magnetic flux, so as to change the penetration depth of the magnetic flux. A lifting magnet typically used in a plate mill of a steel works is designed in such a way that a large amount of magnetic flux can be applied from a large magnetic pole to steel plates. Accordingly, since the maximum magnetic flux penetration depth is large, a small change in current leads to significant changes in magnetic flux penetration depth. Therefore, the number of steel plates to be lifted cannot be properly controlled, because of significant impact of gaps created by warpage of steel plates or depending on surface quality.

The lifting magnet described in Patent Literature 2 is configured to vary the size of an electromagnet to change the penetration depth of magnetic flux. That is, the lifting magnet described in Patent Literature 2 is not one that controls the magnetic flux of the electromagnet to control the number of steel plates to be lifted. Therefore, as in the case of the method described in Patent Literature 1, the lifting magnet described in Patent Literature 2 cannot properly control the number of steel plates to be lifted.

Accordingly, an object of the disclosed embodiments is to solve the problems of the related art described above, and to provide not only a lifting magnet and a steel plate lifting apparatus that can achieve improved performance of controlling the number of steel plates to be lifted during control operation, but also provide a steel plate conveying method.

Solution to Problem

The disclosed embodiments for solving the aforementioned problems are summarized as follows.

[1] A lifting magnet includes a plurality of electromagnetic coils arranged in a nested manner and configured to be independently ON/OFF-controlled and voltage-controlled.

[2] The lifting magnet according to [1] further includes an inner pole disposed inside an innermost one of the electromagnetic coils; an intermediate pole interposed between adjacent ones of the electromagnetic coils; an outer pole disposed outside an outermost one of the electromagnetic coils; and a yoke disposed in contact with upper ends of the inner pole, the intermediate pole, and the outer pole.

[3] The lifting magnet according to [1] or [2] further includes a magnetic flux sensor configured to measure a magnetic flux density directly under magnetic poles.

[4] In the lifting magnet according to [3], the magnetic flux sensor is disposed at a lower end of the inner pole.

[5] In the lifting magnet according to any one of [2] to [4], a maximum amount of magnetic flux of the innermost one of the electromagnetic coils is smaller than a maximum amount of magnetic flux of the rest of the electromagnetic coils.

[6] A steel plate lifting apparatus includes the lifting magnet according to any one of [3] to [5], and a control device configured to control an operation of the plurality of electromagnetic coils by using a result of measurement made by the magnetic flux sensor.

[7] In the steel plate lifting apparatus according to [5], the control device is configured to perform control in such a way that a voltage corresponding to a set number of steel plates to be lifted is applied to the electromagnetic coils; calculate, from the magnetic flux density measured by the magnetic flux sensor, a magnetic flux penetration depth for the steel plates to be lifted; determine, from the calculated magnetic flux penetration depth, whether the number of steel plates to be lifted matches the set number; and control the voltage applied to the electromagnetic coils on the basis of the determination.

[8] In the steel plate lifting apparatus according to [7], for lifting steel plates, the control device controls a voltage applied to the innermost one of the electromagnetic coils to control the number of steel plates to be lifted.

[9] In the steel plate lifting apparatus according to any one of [6] to [8], the control device performs control in such a way that some of the electromagnetic coils is excited for lifting steel plates, and that at least one of the rest of the electromagnetic coils is excited for conveying the lifted steel plates.

[10] A steel plate conveying method carried out by using the steel plate lifting apparatus according to any one of [6] to [9] is a steel plate conveying method that includes lifting steel plates to be conveyed by exciting some of the electromagnetic coils; and conveying, after the lifting, the lifted steel plates by exciting at least one of the rest of the electromagnetic coils.

[11] In the steel plate conveying method according to [10], the steel plates are lifted by exciting the innermost one of the electromagnetic coils; and after the lifting, the lifted steel plates are conveyed by exciting the rest of the electromagnetic coils.

Advantageous Effects

In the disclosed embodiments, where a plurality of electromagnetic coils are arranged in a nested manner and configured to be independently ON/OFF-controlled and voltage-controlled, the electromagnetic coils can be used either selectively or in combination. The magnetic flux penetration depth can thus be controlled with high precision depending on the number of steel plates to be lifted.

Also, when the lifting magnet includes a magnetic flux sensor for measuring the magnetic flux density directly under the magnetic poles, the magnetic flux penetration depth for steel plates to be lifted can be calculated from the magnetic flux density measured by the magnetic flux sensor, and the attracted state of the steel plates can be determined from the calculated magnetic flux penetration depth. For example, a steel plate lifting apparatus calculates, from the magnetic flux density measured by the magnetic flux sensor, the magnetic flux penetration depth for steel plates to be lifted, determines, from the calculated magnetic flux penetration depth, the attracted state of the steel plates, and performs feedback control on a voltage applied to the electromagnetic coil on the basis of the determination. This is advantageous in that the number of steel plates to be lifted can be controlled with high precision, and that the operation of conveying steel plates can be made more efficient.

DETAILED DESCRIPTION

Figure 1:
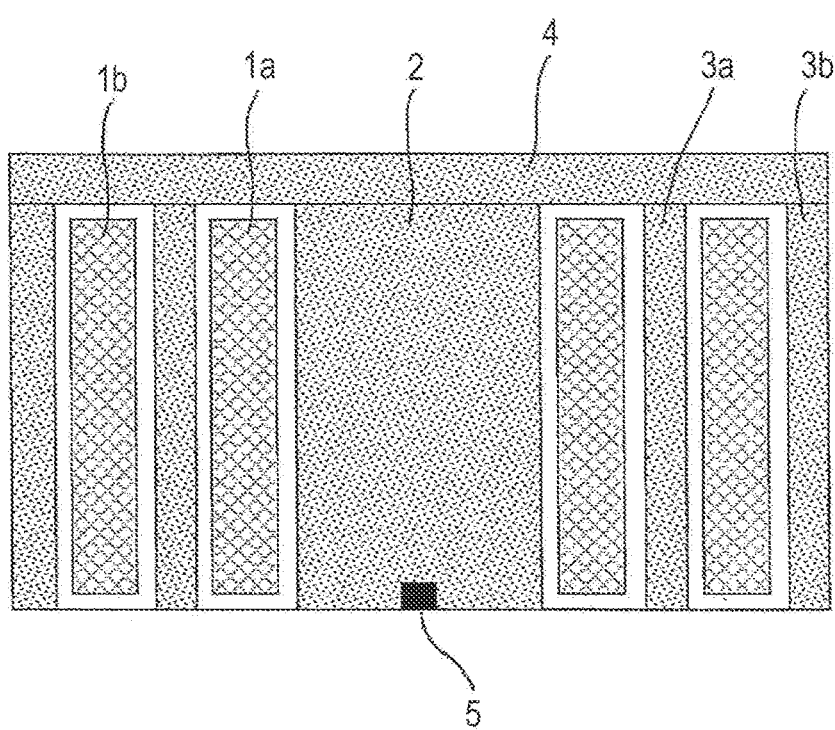
FIG. 1 is a vertical cross-sectional view schematically illustrating an embodiment of a lifting magnet according to an embodiment.

FIG. 1 is a vertical cross-sectional view schematically illustrating an embodiment of a lifting magnet according to the disclosed embodiments. Typically, the lifting magnet is raised, lowered, and moved while being held in a suspended state by a crane (not shown).

The lifting magnet includes a plurality of electromagnetic coils 1a and 1b arranged in a nested manner and capable of being independently ON/OFF-controlled and voltage-controlled. In the present embodiment, the lifting magnet includes the first electromagnetic coil 1a on the inner side and the second electromagnetic coil 1b on the outer side (hereinafter, "electromagnetic coil" will be simply referred to as "coil" for convenience in explanation). This lifting magnet has a horizontal cross-section, such as that illustrated in FIG. 9.

The first coil 1a and the second coil 1b are, for example, ring-shaped exciting coils insulated by being wound many times with an enameled copper wire. The two coils 1a and 1b are arranged in a nested manner, with an intermediate pole 3*a* interposed therebetween. The two coils 1*a* and 1*b* have different ring diameters.

Although the plurality of coils 1*a* and 1*b* are concentrically arranged in this example, they simply need to be arranged in a nested manner and do not necessarily need to be concentrically arranged.

An inner pole 2 formed by, for example, a cylindrical iron core is disposed inside the first coil 1*a* on the inner side. The intermediate pole 3*a* formed by a ring-shaped iron core is interposed between the first coil 1*a* and the second coil 1*b*. An outer pole 3*b* formed by a ring-shaped iron core is disposed outside the second coil 1*b*. Additionally, a yoke 4 is disposed to be in contact with, and secured to, the upper ends of the inner pole 2, the intermediate pole 3*a*, and the outer pole 3*b*.

While not shown, gaps between the coils 1*a* and 1*b* and the magnetic poles and the yoke 4 are filled with a non-magnetic material, such as a resin, for securing the coils 1*a* and 1*b* in place. The inner pole 2, the intermediate pole 3*a*, the outer pole 3*b*, and the yoke 4 are formed of a soft magnetic material, such as mild steel, and some or all of them may constitute an integral structure.

The lifting magnet of the present embodiment includes a magnetic flux sensor 5 that measures a magnetic flux density of a magnetic pole. From the magnetic flux density measured by the magnetic flux sensor 5, a magnetic flux penetration depth for steel plates to be lifted (or conveyed) can be determined. Since the magnetic flux penetration depth shows the thickness (or number) of steel plates in an attracted state, it is possible to determine whether a desired number of steel plates to be lifted are in an attracted state.

Accordingly, a steel plate lifting apparatus includes a lifting magnet including the magnetic flux sensor 5, and a control device 6 configured to control the number of steel plates to be lifted on the basis of the magnetic flux density measured by the magnetic flux sensor 5. Specifically, the control device 6 calculates, from a magnetic flux density measured by the magnetic flux sensor, a magnetic flux penetration depth for steel plates to be lifted, determines, from the calculated magnetic flux penetration depth, an attracted state of steel plates, and performs feedback control on a voltage applied to an electromagnetic coil on the basis of the determination. The number of steel plates to be lifted can thus be controlled with particularly high precision, and the operation of lifting and conveying the steel plates can be made more efficient.

Figure 4:
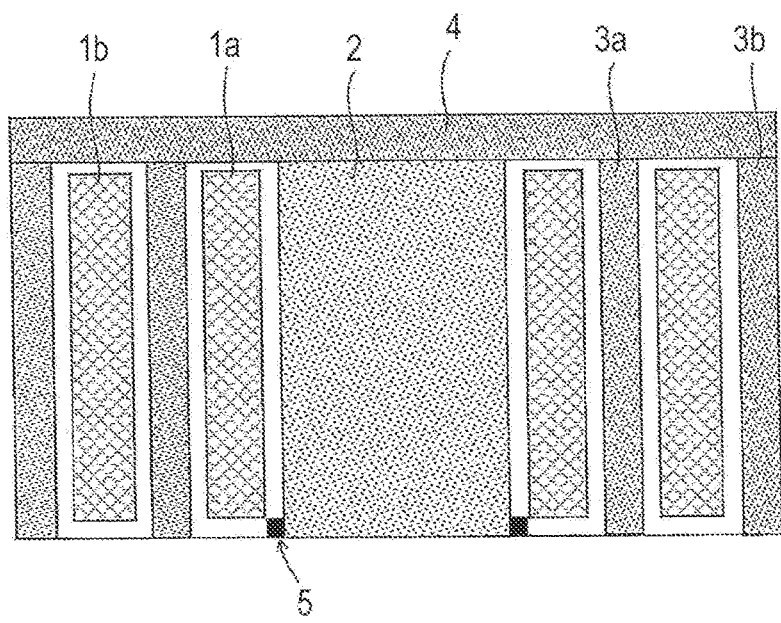
FIG. 4 is a vertical cross-sectional view schematically illustrating another embodiment of the lifting magnet according to an embodiment.

The magnetic flux sensor 5 is constituted, for example, by a Hall element or a search coil. The magnetic flux sensor 5 of the present embodiment is constituted by a Hall element. The magnetic flux sensor 5 may be installed at any position where the magnetic flux density of the magnetic pole can be measured. In the present embodiment, the magnetic flux sensor 5 is installed at the lower end (or at the center of the lower end) of the inner pole 2 to measure the magnetic flux density of the magnetic flux that passes through the inner pole 2. The magnetic flux penetration depth can be calculated on the basis of the magnetic flux density of the inner pole 2 measured by the magnetic flux sensor 5. A plurality of magnetic flux sensors 5 may be provided at different positions of the magnetic pole (inner pole 2 or/and intermediate pole 3*a*, outer pole 3*b*). FIG. 4 is a vertical cross-sectional view schematically illustrating another embodiment of the lifting magnet according to the disclosed embodiments. In this embodiment, the magnetic flux sensor 5 is constituted by a search coil, which is disposed along the circumferential direction at the lower end of the inner pole 2.

The magnetic flux sensor 5 is preferably installed in such a way that it can measure the magnetic flux density of the magnetic flux passing through the inner pole 2. Here, the magnetic flux density is considered substantially uniform within the lower surface of the inner pole. In the present embodiment illustrated in FIG. 1, where the magnetic flux sensor 5 is constituted by a Hall element, the magnetic flux density is measured by the magnetic flux sensor 5 installed at the center of the lower end of the inner pole 2. On the other hand, when the magnetic flux sensor 5 is constituted by a search coil as in the case of the embodiment illustrated in FIG. 4, the amount (or total amount) of magnetic flux on the lower surface of the inner pole is measured by the search coil. Accordingly, an in-plane average value obtained by dividing the measured amount (or total amount) of magnetic flux by the area of the lower surface of the inner pole is determined as the magnetic flux density of the inner pole 2.

Although the lifting magnet is described as including two coils 1*a* and 1*b* in this example, it may include three or more coils arranged in a nested manner. In this case, again, the inner pole 2 is disposed inside the innermost one of the coils, the intermediate pole 3*a* is interposed between two adjacent coils 1, and the outer pole 3*b* is disposed outside the outermost one of the coils. Including three or more coils arranged in a nested manner, as described above, is advantageous in that when the number of steel plates to be lifted is to be finely defined in such a manner as one, two to three, four to five, or six to seven, a wide range of voltage control is permitted in each case.

The magnetic flux penetration depth required for retaining steel plates during conveyance can be secured by simultaneously exciting the plurality of coils 1*a* and 1*b*. During lifting of steel plates, the magnetic flux penetration depth can be controlled with high precision by independently exciting at least one of individual coils 1 (e.g., the first coil 1*a* in the embodiments illustrated in FIG. 1 and FIG. 4) having a relatively small number of coil turns N. The principle will now be described.

Figure 10:
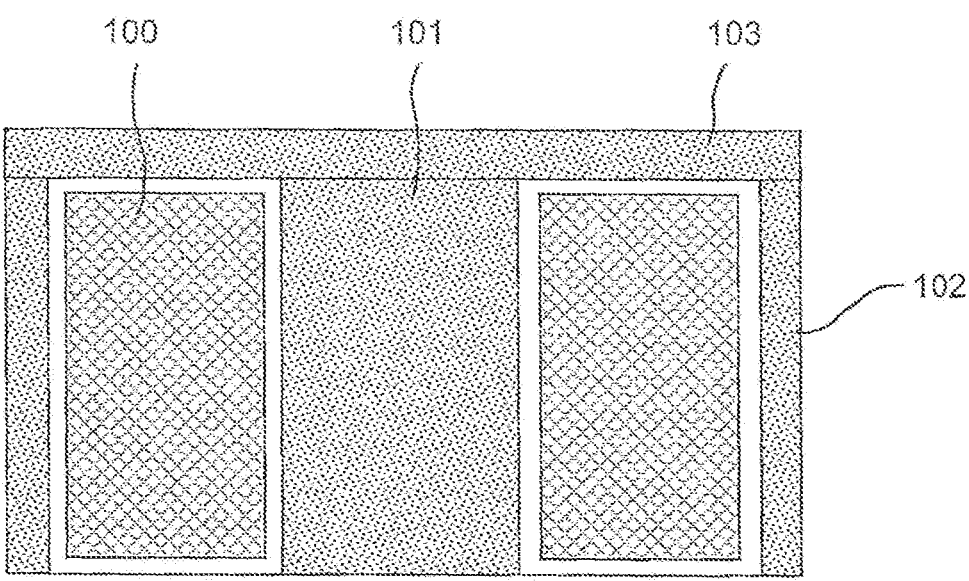
FIG. 10 is a vertical cross-sectional view schematically illustrating a typical conventional lifting magnet.

In the case of lifting steel plates with a lifting magnet, such as that illustrated in FIG. 10, the amount of magnetic flux that can pass in the steel plates can be expressed as $\pi \times \varnothing_I \times t \times B_s$, where $\varnothing_I$ (mm) is an inner pole diameter, t (mm) is the total plate thickness of steel plates to be lifted, and $B_s$ (T) is the saturation magnetic flux density of the steel plates. Accordingly, when a stack of "n" steel plates of the same material is attracted to and lifted by the lifting magnet, if the amount of magnetic flux M produced by applying a voltage to the coil satisfies Equation (1) described below, it is theoretically possible that the magnetic flux will penetrate to the lower surface of the n-th steel plate from the top, and that sufficient lifting force can be obtained. In other words, in Equation (1), the total plate thickness t of the lifted steel plates is equivalent to the magnetic flux penetration depth:

$$M = \pi \times \varnothing_I \times \Sigma_{k=1}{}^{\sim}{}_n(t_k) \times B_s \qquad (1)$$

where $t_k$ is the plate thickness of each steel plate to be lifted, and $t = \Sigma_{k=1}{}^{\sim}{}_n(t_k)$ is the total plate thickness of the steel plates to be lifted (=magnetic flux penetration depth).

M can be expressed as $S \times B$, where S (mm$^2$) is the cross-sectional area of the inner pole 2, and B (T) is the magnetic flux density of the inner pole 2. Equation (1) described above can thus be expressed by Equation (2) below:

$$S \times B = \pi \times \varnothing_I \times \Sigma_{k=1}{}^{\sim}{}_n(t_k) \times B_s \qquad (2).$$

Since the magnetic flux density B is proportional to the product of the number of coil turns N and current I in the coil, Equation (2) described above can be expressed by Equation (3) below:

$$N \times I \times \alpha \times S = \pi \times \emptyset_I \times \Sigma_{k=1} \,\tilde{}_n(t_k) \times B_s \qquad (3)$$

where $\alpha$ is a proportionality constant.

The current I in Equation (3) is set depending on the number of steel plates to be lifted "n" and the plate thickness $t_k$. The current I is controlled by a drive voltage V applied, for example, from an inverter circuit to each of the coils 1a and 1b. In Equation (3), the number of turns N, the cross-sectional area S, and the inner pole diameter $\emptyset_I$ are known values, and the proportionality constant $\alpha$ and the saturation magnetic flux density $B_s$ are known, for example, from the material of steel plate to be lifted. Therefore, the current I is set depending on the set number of plates to be lifted. When the number of coil turns N is small, the amount of change in left-side value with respect to error $\Delta I$ in current I is small. This makes it possible to control, with high precision, the magnetic flux penetration depth that allows Equation (3) to be established, and to precisely control the number of steel plates to be lifted.

By exciting the plurality of coils 1a and 1b at the same time, the magnetic flux penetration depth required for retaining the steel plates during conveyance after being lifted can be secured. This makes it possible to reduce the number of coil turns N of each of the coils 1a and 1b. In the embodiments illustrated in FIG. 1 and FIG. 4, where a necessary magnetic flux penetration depth can be secured by exciting the first coil 1a and the second coil 1b at the same time, the number of coil turns N of each of the first coil 1a and the second coil 1b can be reduced.

Therefore, for example, by exciting the first coil 1a alone, a magnetic flux penetration depth that allows Equation (3) to be established can be controlled with high precision, and the number of steel plates to be lifted can be precisely controlled even when the steel plates to be lifted are thin plates.

The lifting magnets illustrated in FIG. 1 and FIG. 4 both have a compact structure, because the plurality of electromagnetic coils therein is concentrically arranged.

To enable the coil on the outer side to exert sufficient attracting force during conveyance of steel plates, the maximum amount of magnetic flux of the coil 1a on the innermost side is preferably smaller than the maximum amount of magnetic flux of the coil 1b on the outer side. Accordingly, the number of coil turns of the first coil 1a on the innermost side is preferably smaller than the number of coil turns of the second coil 1b on the outer side. Note that when the lifting magnet includes three or more coils, it is simply required that the number of turns N of the first coil 1a on the innermost side be smaller than the number of turns of the coils on the outer side. The coils on the outer side may have either the same or different numbers of turns.

Figure 2:
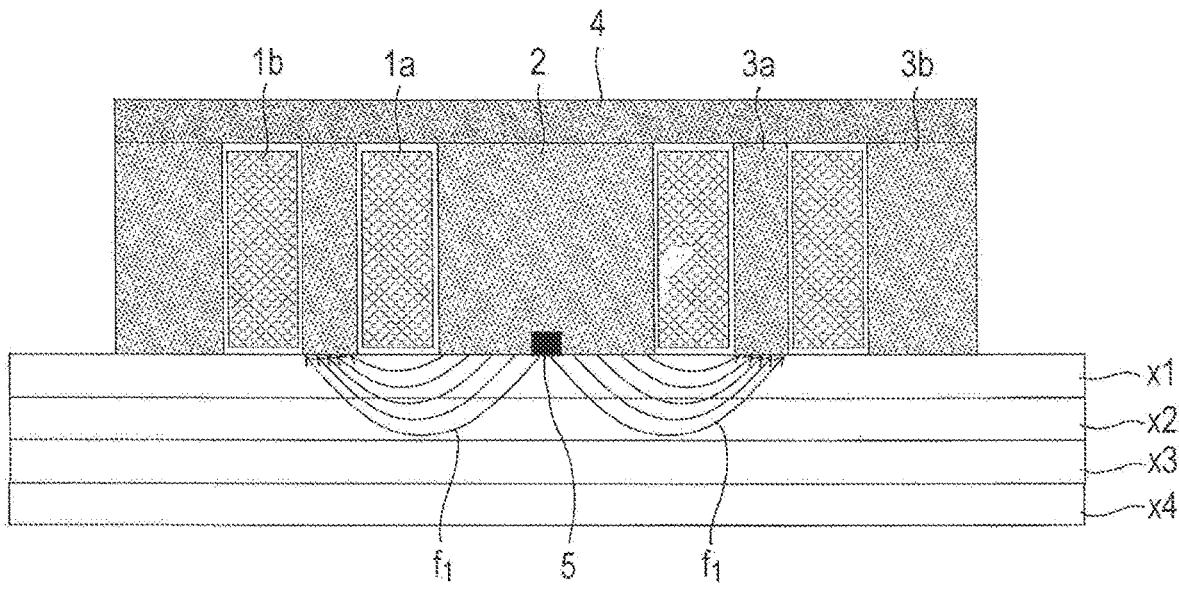
FIG. 2 is a diagram (vertical cross-sectional view) schematically illustrating how magnetic flux flows in steel plates during excitation of an electromagnetic coil on the inner side in the lifting magnet according to the embodiment illustrated in FIG. 1.

FIG. 2 is a schematic diagram illustrating magnetic flux produced while steel plates are being lifted by the lifting magnet according to the embodiment illustrated in FIG. 1. Note that FIG. 2 illustrates an example where two steel plates x1 and x2 are set as steel plates to be lifted.

To control the number of steel plates to be lifted, as illustrated in FIG. 2, a drive voltage required to lift the two steel plates x1 and x2 is applied to the first coil 1a alone, and this produces a magnetic flux $f_1$ passing between the inner pole 2 and the intermediate pole 3a. Since this magnetic flux $f_1$ passes through only two upper steel plates x1 and x2 of the steel plates x1 to x4 stacked, the two steel plates x1 and x2 alone are attracted to the lifting magnet.

As the lifting magnet rises in this state, the two steel plates x1 and x2 are lifted. The lifted steel plates are then conveyed. During conveyance, the steel plates are subjected to external force resulting from, for example, swinging or swaying of the crane. If the magnetic flux penetration depth is not large enough, the steel plate x2 on the lower side may be detached and dropped from the lifting magnet, due to gaps created by warpage of the steel plates. To avoid such a risk during conveyance of steel plates, it is required to satisfy $N \times I \times \alpha \times S >>> \pi \times \emptyset \times \Sigma_{k=1} \,\tilde{}_n(t_k) \times B_s$ (where $\emptyset$ is the diameter of the outer pole in the case of exciting both the first coil 1a and the second coil 1b), and it is preferable that a maximum voltage be applied to the first coil 1a and the second coil 1b. To avoid the risk of dropping of the steel plates, for example, it is preferable that the left side of the inequality $N \times I \times \alpha \times S >> \pi \times \emptyset \times \Sigma_{k=1} \,\tilde{}_n(t_k) \times B_s$ be at least three times the right side thereof.

In the case of exciting both the first coil 1a and the second coil 1b, the coils 1a and 1b are independently controlled, and a drive voltage is applied to each of the coils 1a and 1b to cause current to flow. Accordingly, the inequality described above is based on a value obtained by combining Equation (3) calculated for each of the coils 1a and 1b. Although both the coils 1a and 1b are driven for conveyance of the lifted steel plates in this example, the first coil 1a alone may be excited for the conveyance. In the case of exciting the first coil 1a alone, $\emptyset$ in the inequality described above is the diameter of the inner pole.

Figure 3:
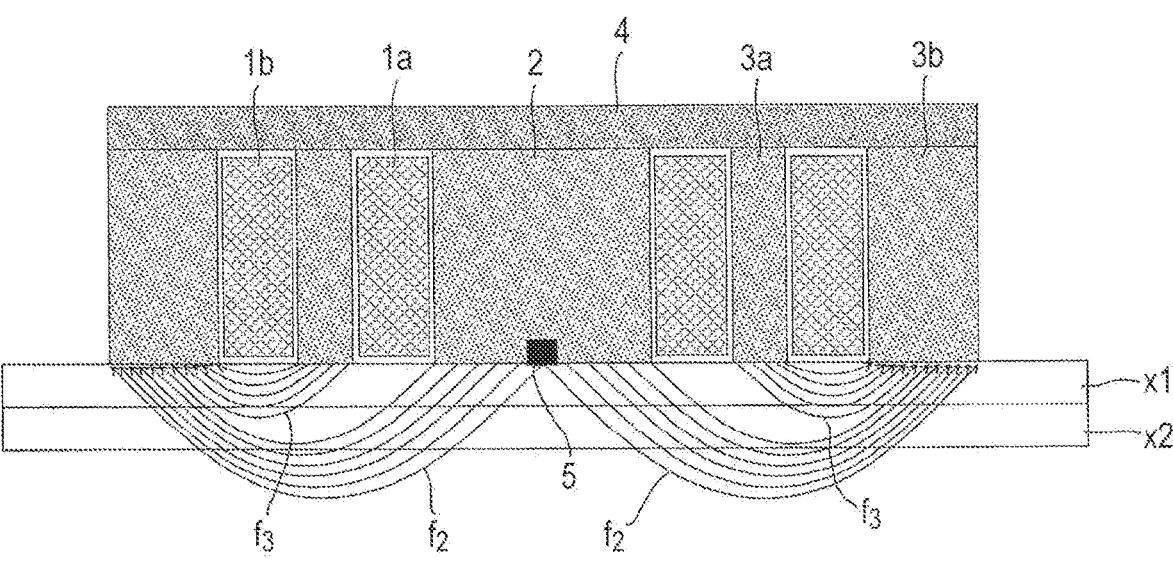
FIG. 3 is a diagram (vertical cross-sectional view) schematically illustrating how magnetic flux flows in steel plates during excitation of electromagnetic coils on the inner and outer sides in the lifting magnet according to the embodiment illustrated in FIG. 1.

For conveyance of the steel plates, as illustrated in FIG. 3, a voltage is also applied to the second coil 1b to excite both the first coil 1a and the second coil 1b, so that the magnetic flux penetration depth is increased to ensure lifting stability. That is, by applying a voltage not only to the first coil 1a but also to the second coil 1b, a magnetic flux $f_2$ passing between the inner pole 2 and the outer pole 3b and a magnetic flux $f_3$ passing between the intermediate pole 3a and the outer pole 3b are produced. The magnetic flux $f_2$ is produced with a large number of coil turns N of both the first coil 1a and the second coil 1b. Thus, with the large magnetic flux penetration depth, such as that illustrated in FIG. 3, it is possible to reliably retain the steel plates x1 and x2 during conveyance and eliminate the risk of dropping of the steel plates x1 and x2.

Although the description has been made using the embodiment illustrated in FIG. 1 as an example, the same applies to the embodiment illustrated in FIG. 4.

The size of the lifting magnet and the force of retaining the steel plates (maximum magnetic flux penetration depth) are preferably designed as follows. That is, when the diameter $\emptyset_0$ of the intermediate pole 3a is applied to Equation (3), the magnetic flux penetration depth t is determined by the ratio between $(N \times I \times \alpha \times S)$ and $(\pi \times \emptyset_0 \times B_s)$ on the left side and the right side, respectively, of Equation (3). The number of coil turns N and the diameter $\emptyset_0$ of the intermediate pole 3a are preferably designed to make the ratio equal to that in the conventional lifting magnet (FIG. 10). The number of coil turns of the first coil 1a on the innermost side and the diameter of the inner pole 2 are preferably determined in such a way that when a maximum voltage is applied to the first coil 1a on the innermost side, the magnetic flux penetration depth t is within the plate thickness range in which the number of steel plates to be lifted can be controlled with high precision.

A steel plate conveying method using the lifting magnet described above will now be described. The steel plate conveying method includes a lifting step which involves lifting steel plates in a vertical direction, and a conveying step which involves moving the lifted steel plates in a horizontal direction. In the lifting step, one (coil $1a$) of the plurality of coils $1a$ and $1b$ is excited, so that the steel plates are lifted. In the conveying step after the lifting, not only the first coil $1a$ but also at least one (coil $1b$) of the other coils is excited, so that the lifted steel plates are conveyed while being retained by the plurality of coils $1a$ and $1b$.

Although the coil 1 excited in the lifting step is not limited to a specific one, the first coil $1a$ on the innermost side is preferably excited, as illustrated in FIG. 2. This is because since the first coil $1a$ on the innermost side has a small magnetic pole diameter, the magnetic flux penetration depth does not change considerably with respect to a change in magnetic flux density caused by a change in current and therefore, the magnetic flux penetration depth can be finely controlled.

Also, in the lifting step, a voltage applied to the excited coil 1 is appropriately adjusted depending on the number of steel plates to be lifted, so that the number of steel plates to be lifted is controlled. During conveyance of the steel plates after the lifting, a maximum voltage is preferably applied to the plurality of first coil $1a$ and second coil $1b$ for lifting stability.

Figure 5:
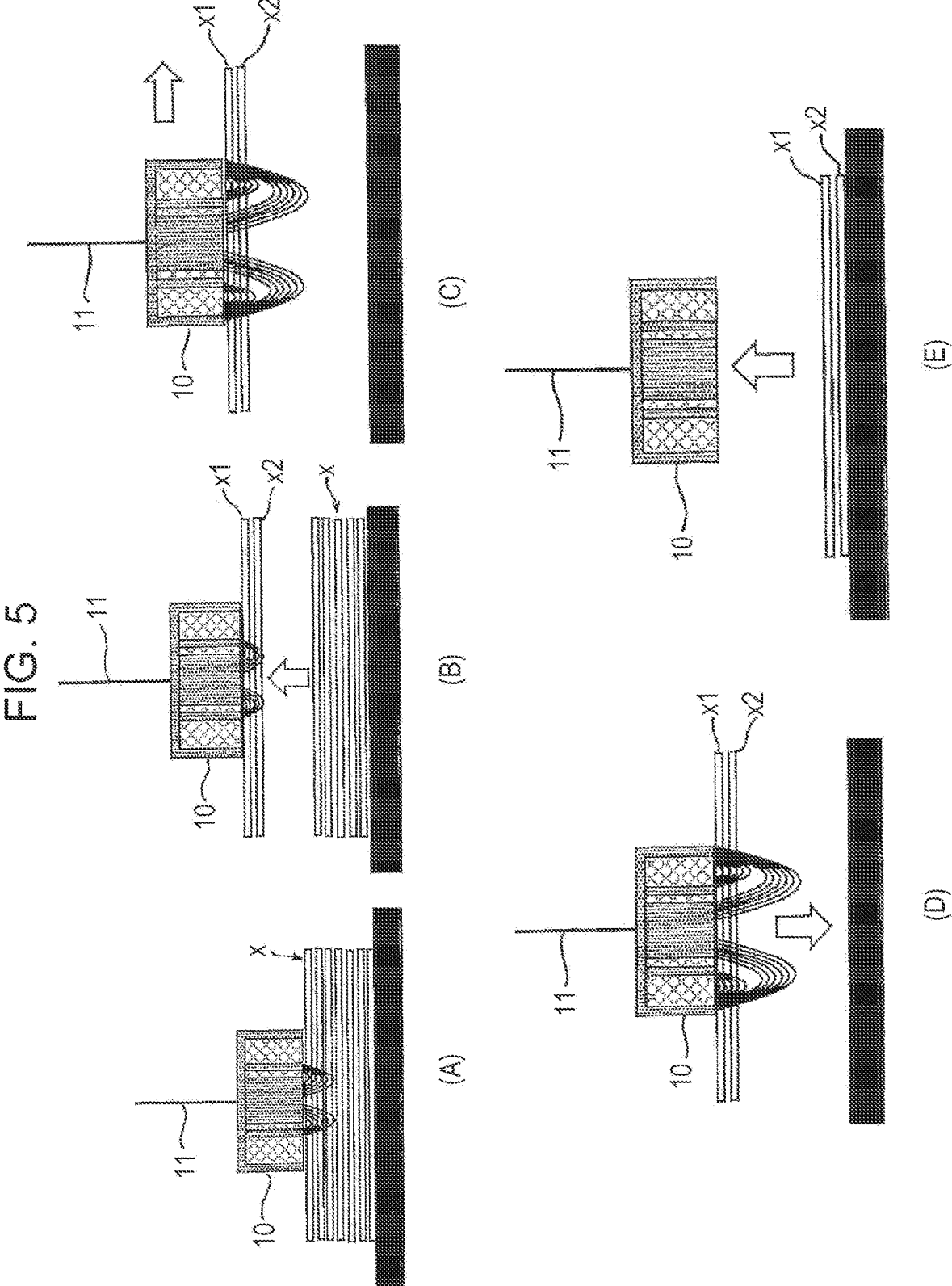
FIG. 5 is a series of explanatory diagrams illustrating an exemplary procedure of conveying steel plates by means of a lifting magnet according to an embodiment.

FIG. 5 illustrates an exemplary procedure of conveying steel plates by means of a lifting magnet according to the disclosed embodiments (i.e., the lifting magnet of the embodiment illustrated in FIG. 1 or FIG. 4). In the drawing, reference numeral 10 denotes a lifting magnet according to the disclosed embodiments, reference numeral 11 denotes a lifting wire of a crane, and x denotes a stack of steel plates. First in the lifting step, as illustrated in FIG. 5(A), a voltage is applied to the first coil $1a$ alone to turn on the first coil $1a$, the voltage of the first coil $1a$ is controlled so as to adjust the magnetic flux penetration depth in accordance with the number of steel plates x to be lifted (two plates in this example), and the two steel plates x1 and x2 are lifted as illustrated in FIG. 5(B). Next, at the beginning of the conveying step, as illustrated in FIG. 5(C), a voltage is applied not only to the first coil $1a$ but also to the second coil $1b$, so as to turn on the second coil $1b$. The voltage applied to the first coil $1a$ and the second coil $1b$ is maximized, so as to provide a magnetic flux penetration depth that is large enough to allow the steel plates x1 and x2 to be stably retained and conveyed. The steel plates x1 and x2 thus start to be conveyed. Upon arrival at the destination, as illustrated in FIG. 5(D), the steel plates x1 and x2 are lowered and grounded. Then as illustrated in FIG. 5(E), the first coil $1a$ and the second coil $1b$ are turned off to end the conveyance.

In the lifting magnet including the magnetic flux sensor 5, such as those of the embodiments illustrated in FIG. 1 and FIG. 4, the magnetic flux penetration depth for the steel plates to be conveyed is calculated from the magnetic flux density measured by the magnetic flux sensor 5. From the magnetic flux penetration depth, the attracted state of the steel plates can be determined. Therefore, the steel plates are preferably lifted by using a steel plate lifting apparatus that includes the lifting magnet including the magnetic flux sensor 5 as described above, and the control device 6 configured to automatically control the number of steel plates to be lifted on the basis of the magnetic flux density measured by the magnetic flux sensor 5.

Figure 6:
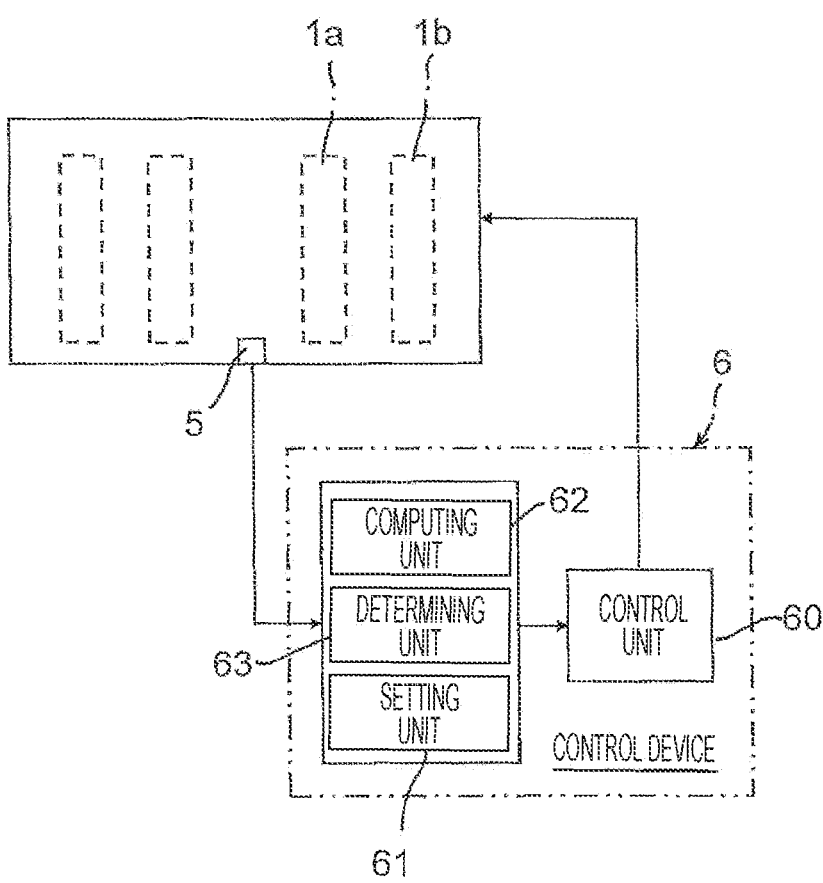
FIG. 6 is a block diagram illustrating a preferred embodiment of a steel plate lifting apparatus according to an embodiment.

FIG. 6 is a block diagram illustrating a preferred embodiment of a steel plate lifting apparatus according to the disclosed embodiments. The configuration of the control device 6, such as that illustrated in FIG. 6, is constructed by a hardware resource, such as a computer.

The first coil $1a$ and the second coil $1b$ are capable of being independently ON/OFF-controlled and voltage-controlled by the control device 6. That is, for lifting and conveying the steel plates, the control device 6 ON/OFF-controls the first coil $1a$ and the second coil $1b$, and controls the voltage applied to the first coil $1a$ and the second coil $1b$ independently depending on, for example, the plate thickness of steel plates and the number of steel plates to be lifted. Additionally, the control device 6 calculates, from the magnetic flux density measured by the magnetic flux sensor 5, the magnetic flux penetration depth for steel plates to be lifted, determines, from the magnetic flux penetration depth, the attracted state of steel plates, and performs feedback control on the voltage applied to the first coil $1a$ on the basis of the determination, so as to automatically control the number of steel plates to be lifted. For the operation described above, the control device 6 includes a control unit 60 configured to independently ON/OFF-control and voltage-control the first coil $1a$ and the second coil $1b$, a setting unit 61 configured to set the plate thickness of steel plates to be conveyed and the number of steel plates to be lifted, a computing unit 62 configured to calculate a magnetic flux penetration depth t using Equation (2) from the magnetic flux density measured by the magnetic flux sensor 5, and a determining unit 63 configured to determine the number of attracted steel plates on the basis of the magnetic flux penetration depth t calculated by the computing unit 62 and determine whether the number of attracted steel plates matches the set number of steel plates.

To control the number of steel plates to be lifted, the first coil $1a$ alone is excited to attract steel plates, and in accordance with a set plate thickness of steel plates and the number of steel plates to be lifted, the setting unit 61 sets a voltage to be applied to achieve a target magnetic flux penetration depth. The control unit 60 performs control in such a way that the voltage set by the setting unit 61 is applied to the first coil $1a$. The magnetic flux sensor 5 measures the magnetic flux density of the magnetic flux passing through the inner pole 2, and from the magnetic flux density measured, the computing unit 62 calculates the magnetic flux penetration depth for the steel plates to be conveyed. From the magnetic flux penetration depth, the thickness of steel plates (the number of steel plates n) in an attracted state can be determined. From the magnetic flux penetration depth t, the determining unit 63 determines the number of attracted steel plates n, compares the number of attracted plates n to a set number of plates to be attracted, and determines whether they match. On the basis of the result of comparison, the control unit 60 performs feedback control on the voltage applied to the first coil $1a$ in such a way that the number of attracted plates n is adjusted to the set number.

Figure 7:
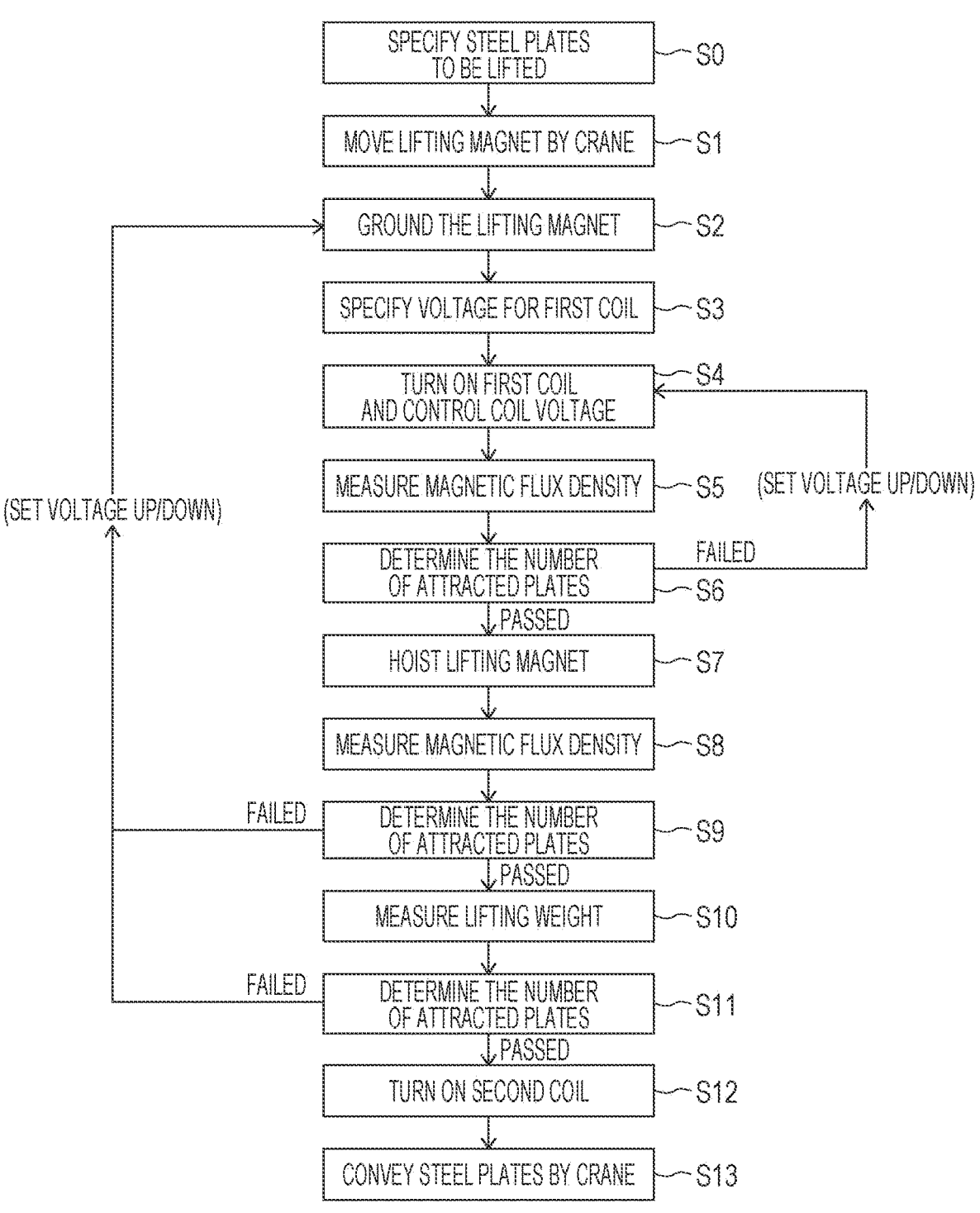
FIG. 7 is a flowchart illustrating a preferred embodiment of a steel plate conveying method according to an embodiment.

FIG. 7 is a flowchart illustrating a preferred embodiment of a steel plate conveying method according to the disclosed embodiments. After the number of steel plates to be lifted (or conveyed) is specified (step S0), the lifting magnet is moved by a crane to a position above the steel plates (step S1) and grounded on the upper surface of the steel plates (step S2). After a voltage to be applied to the first coil $1a$ is specified in accordance with the number of steel plates to be lifted (step S3), the first coil $1a$ alone is excited and voltage-controlled (step S4). Thus, a certain number of steel plates corresponding to the applied voltage are attracted to the lifting magnet. The magnetic flux density B is measured by the magnetic flux sensor 5 (step S5), and the number of attracted steel plates is determined on the basis of a magnetic flux penetration depth determined from the magnetic flux density B (step S6). If the number of steel plates does not match the specified number of steel plates ("FAILED" in step S6), voltage control is performed to increase or decrease the voltage applied to the first coil 1a (step S4). On the other hand, if the number of steel plates matches the specified number of steel plates, the steel plates are lifted and the lifting magnet is hoisted to a predetermined height position (step S7). To check the number of lifted steel plates again at the predetermined height position, the magnetic flux density is measured again by the magnetic flux sensor 5 (step S8). Then, on the basis of the magnetic flux penetration depth t determined from the magnetic flux density, the number of attracted steel plates is determined (step S9). If the number of steel plates does not match the specified number of steel plates ("FAILED" in step S9), the steel plates are lowered to the original position and grounded (step S2) and a voltage to be applied is specified again (step S3). On the other hand, if the number of steel plates matches the specified number of steel plates, the lifting weight is further measured, for example, by a weight measuring means attached to a means of lifting the lifting magnet (step S10). The number of attracted steel plates is determined on the basis of the measurement of the lifting weight (step S11). If the number of steel plates does not match the specified number of steel plates, the steel plates are lowered to the original position and grounded (step S2) and a voltage to be applied is specified again (step S3). On the other hand, if the number First, the following test was conducted to evaluate the performance of controlling the number of steel plates to be lifted.

The steel plates to be lifted were SS400 plates having a length and width of 500 mm and a plate thickness of 4 mm to 10 mm. With two steel plates stacked on top of each other, each lifting magnet was brought closer to the plates from above to measure the minimum voltage (1) with which one steel plate could be attracted, and the minimum voltage (2) with which two steel plates could be attracted. In the Example device, the first coil 1a alone was excited and used.

The result is shown in Table 1. Table 1 shows that with the conventional device, the first steel plate was attracted at about 7 V to 10 V, the second steel plate was attracted at about 9 V to 12 V, and in a 1 V to 2 V voltage range, the number of steel plates to be lifted was able to be controlled to one. Table 1 also shows that with the Example device, the first steel plate was attracted at about 12 V to 16 V, the second steel plate was attracted at about 17 V to 42 V, and in a 5 V to 27 V voltage range, the number of steel plates to be lifted was able to be controlled to one. Thus, with the Example device, the number of steel plates to be lifted can be controlled to one in a much wider voltage range than with the conventional device, and voltage control for controlling the number of steel plates to be lifted can be done more easily than with the conventional device. In other words, the Example device can control the number of steel plates to be lifted more easily, with higher precision, than the conventional device.

TABLE 1

| | Example Device | | | Conventional Device | | |
|---|---|---|---|---|---|---|
| Steel Plate Thickness | Minimum Voltage (1) for Attracting 1 Steel Plate | Minimum Voltage (2) for Attracting 2 Steel Plates | Voltage Range [Voltage (2)-Voltage (1)] for Controlling the Number of Steel Plates to be Lifted to 1 | Minimum Voltage (1) for Attracting 1 Steel Plate | Minimum Voltage (2) for Attracting 2 Steel Plates | Voltage Range [Voltage (2)-Voltage (1)] for Controlling the Number of Steel Plates to be Lifted to 1 |
| 4 mm | 12 V | 17 V | 5 V | 7 V | 9 V | 2 V |
| 6 mm | 15 V | 24 V | 9 V | 9 V | 10 V | 1 V |
| 8 mm | 16 V | 35 V | 19 V | 10 V | 12 V | 2 V |
| 10 mm | 15 V | 42 V | 27 V | 10 V | 11 V | 1 V | of steel plates matches the specified number of steel plates, the second coil 1b is also excited (step S12) and the lifted steel plates are conveyed (step S13).

EXAMPLES

Example 1

A steel plate lifting test was conducted using a lifting magnet according to the disclosed embodiments (hereinafter referred to as "Example device") illustrated in the vertical cross-sectional view of FIG. 8 and the horizontal cross-sectional view of FIG. 9, and a conventional lifting magnet (hereinafter referred to as "conventional device") illustrated in FIG. 10.

Figure 8:
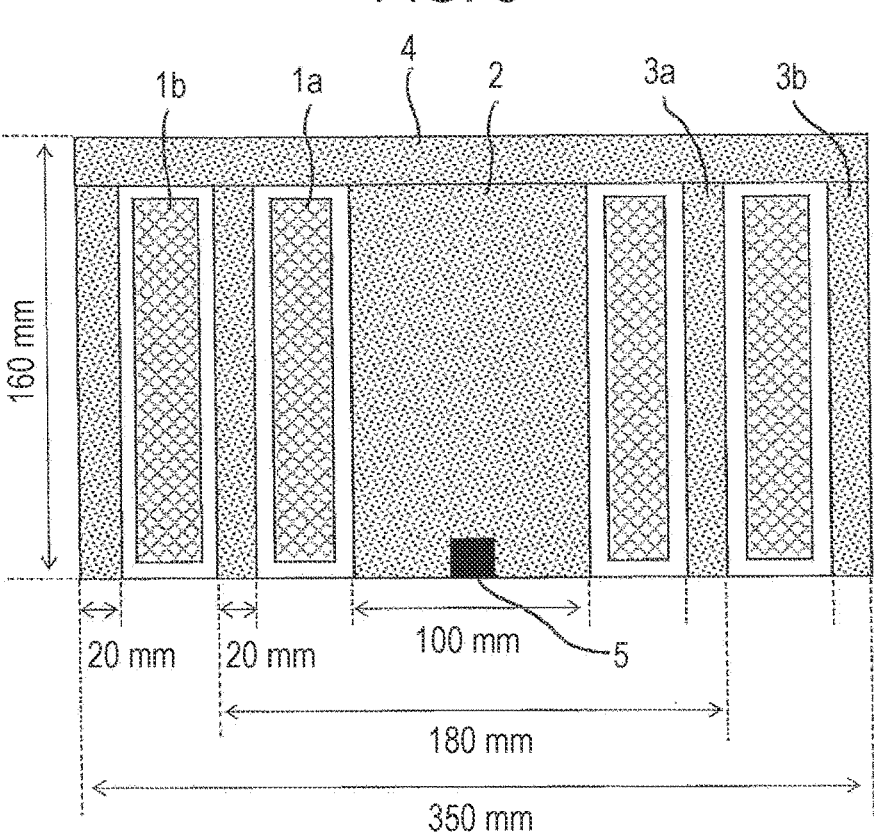
FIG. 8 is a vertical cross-sectional view schematically illustrating a lifting magnet according to an embodiment used in Example 1.
Figure 9:
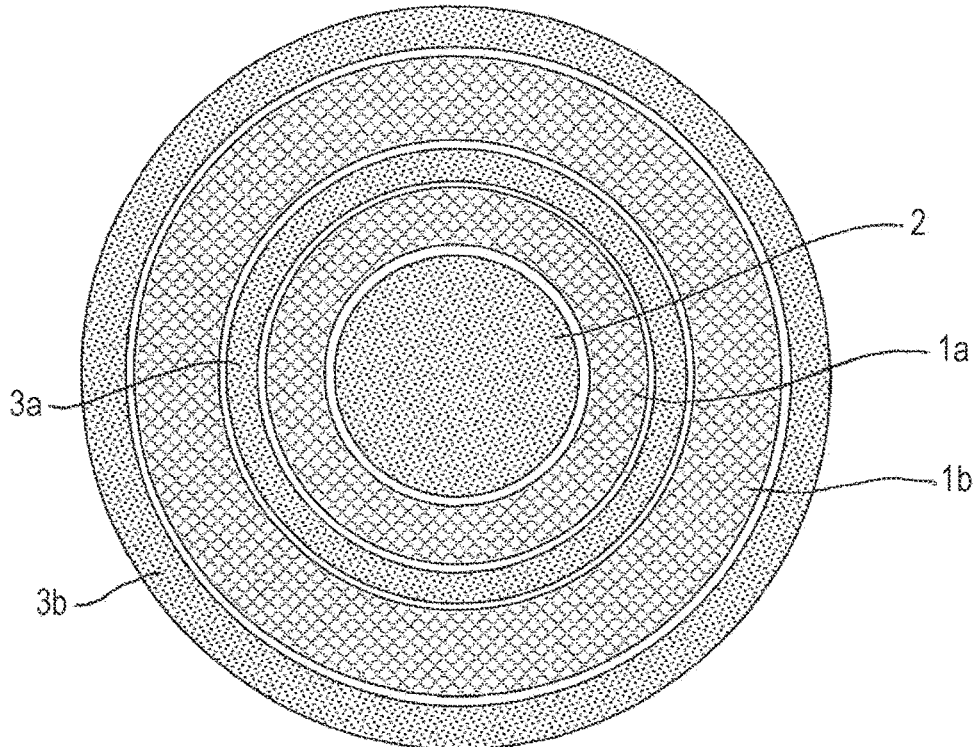
FIG. 9 is a horizontal cross-sectional view of the lifting magnet illustrated in FIG. 8.

Components of the Example device are sized as shown in FIG. 8. The conventional device is 310 mm in outside diameter, 100 mm in height, 150 mm in the diameter of the inner pole 101, and 20 mm in the thickness of the outer pole 102. The first coil 1a and the second coil 1b of the Example device have maximum magnetic flux densities of 1.4 T and 1.5 T, respectively, and the coil of the conventional device has a maximum magnetic flux density of 1.5 T.

Next, to evaluate lifting stability during conveyance, an attracting force for lifting thick steel plates (having a large plate thickness of 10 mm to 40 mm) was measured. In the Example device, both the first coil 1a and the second coil 1b were excited and used. In both the Example device and the conventional device, the attracting force was measured when a voltage applied to the coil was 200 V (rated (maximum) voltage during conveyance).

The result is shown in Table 2. Although there was some variation among different plate thicknesses, the Example device was able to produce substantially the same attracting force as the conventional device.

TABLE 2

| Steel Plate | Attracting Force | |
|---|---|---|
| Thickness | Example Device | Conventional Device |
| 10 mm | 13 kN | 10 kN |
| 15 mm | 30 kN | 30 kN |
| 30 mm | 42 kN | 43 kN |
| 40 mm | 48 kN | 49 kN |

The result of the present example shows that even in the case of conveying thin steel plates, the Example device can achieve both the performance of controlling the number of steel plates to be lifted during control operation and the stability of lifting during conveyance.

The invention claimed is:

1. A lifting magnet comprising:
a plurality of electromagnetic coils disposed in a nested arrangement and configured to be independently ON/OFF-controlled and voltage-controlled;
an inner pole disposed inside an innermost coil of the plurality of electromagnetic coils;
an intermediate pole interposed between adjacent coils of the plurality of electromagnetic coils;
an outer pole disposed outside an outermost coil of the plurality of electromagnetic coils; and
a yoke disposed in contact with upper ends of the inner pole, the intermediate pole, and the outer pole; wherein a maximum amount of magnetic flux of the innermost coil is smaller than a maximum amount of magnetic flux of all other electromagnetic coils.

2. The lifting magnet according to claim 1, further comprising a magnetic flux sensor configured to measure a magnetic flux density directly under magnetic poles of the lifting magnet.

3. The lifting magnet according to claim 2, wherein the magnetic flux sensor is disposed at a lower end of an inner pole disposed inside an innermost coil of the plurality of electromagnetic coils.

4. A steel plate lifting apparatus comprising:
the lifting magnet according to claim 3; and
a control device programmed to execute a step of controlling an operation of the plurality of electromagnetic coils using a magnetic flux density measured by the magnetic flux sensor.

5. A steel plate lifting apparatus comprising:
the lifting magnet according to claim 3; and
a control device programmed to execute a step of controlling an operation of the plurality of electromagnetic coils using a magnetic flux density measured by the magnetic flux sensor.

6. The steel plate lifting apparatus according to claim 5, wherein the control device performs the control such that a voltage corresponding to a set number of steel plates to be lifted is applied to the plurality of electromagnetic coils, and the control device is further programmed to execute the steps of:
calculating, from the magnetic flux density measured by the magnetic flux sensor, a magnetic flux penetration depth for the steel plates to be lifted;
determining, from the calculated magnetic flux penetration depth, whether the number of steel plates to be lifted matches the set number; and
controlling the voltage applied to the plurality of electromagnetic coils on a basis of the determination.

7. The steel plate lifting apparatus according to claim 6, wherein the control device controls a voltage applied to an innermost coil of the plurality of electromagnetic coils to control the number of steel plates to be lifted.

8. The steel plate lifting apparatus according to claim 5, wherein the control device performs the control such that some of the electromagnetic coils are excited for lifting steel plates, and such that at least one of all other electromagnetic coils is excited for conveying the lifted steel plates.

9. A steel plate conveying method performed via the steel plate lifting apparatus according to claim 5, the steel plate conveying method comprising:
lifting steel plates to be conveyed by exciting some of the electromagnetic coils; and
conveying, after the lifting, the lifted steel plates by exciting at least one of all other electromagnetic coils.

10. The steel plate conveying method according to claim 9, wherein the steel plates are lifted by exciting an innermost coil of the plurality of electromagnetic coils; and
after the lifting, the lifted steel plates are conveyed by exciting all other electromagnetic coils.

* * * * *